US011808879B1

(12) United States Patent
Rocca et al.

(10) Patent No.: US 11,808,879 B1
(45) Date of Patent: Nov. 7, 2023

(54) SYSTEMS AND METHODS FOR MODULAR RADAR SYSTEMS

(71) Applicant: Raytheon Company, Waltham, MA (US)

(72) Inventors: Derek P. Rocca, Stow, MA (US); Michael T. Borkowski, Amherst, NH (US); Thomas Lulsdorf, Wilmington, MA (US); Kenneth P. Walsh, Jr., Andover, MA (US); Christopher J. Yafrate, Belmont, MA (US); Michael P. Martinez, Grafton, MA (US); Erin K. Nolan, Montgomery, VT (US); Kassam K. Bellahrossi, Pelham, NH (US); Bryan J. Cavener, Andover, MA (US)

(73) Assignee: Raytheon Company, Waltham, MA (US)

(*) Notice: Subject to any disclaimer, the term of this patent is extended or adjusted under 35 U.S.C. 154(b) by 537 days.

(21) Appl. No.: 16/710,233

(22) Filed: Dec. 11, 2019

Related U.S. Application Data

(60) Provisional application No. 62/853,522, filed on May 28, 2019.

(51) Int. Cl.
*G01S 7/03* (2006.01)
*G01S 7/20* (2006.01)
(Continued)

(52) U.S. Cl.
CPC .......... *G01S 7/032* (2013.01); *H05K 7/20254* (2013.01); *H05K 7/20272* (2013.01); *G01S 7/027* (2021.05)

(58) Field of Classification Search
CPC . G01S 7/032; G01S 7/027; G01S 7/03; G01S 2013/0245; G01S 2013/0254;
(Continued)

(56) References Cited

U.S. PATENT DOCUMENTS 6,005,531 A * 12/1999 Cassen ............... H01Q 21/0025
343/754
7,808,427 B1 * 10/2010 Sarcione ................. H01Q 3/26
342/368
(Continued)

FOREIGN PATENT DOCUMENTS

WO WO-2008112045 A1 * 9/2008 ........... H01L 23/473

*Primary Examiner* — Timothy A Brainard
*Assistant Examiner* — Juliana Cross
(74) *Attorney, Agent, or Firm* — PEARL COHEN ZEDEK LATZER BARATZ LLP

(57) ABSTRACT

A system and apparatus is provided for a modular radar system. The modular radar system can include a plurality of radar system modules that can be detachably coupled and can include a configurable number of radio-frequency (RF) transmit and receive assemblies. The RF transmit and receive assemblies can include radiating element(s) that emit electromagnetic radiation. The plurality of radar system modules can also include at least one processor coupled to control power of the electromagnetic radiation and/or at least one controller to control the RF transmit and receive assembly, the power unit and the digital receiver and exciter module, at least one digital receiver and exciter to convert RF to digital in receive mode, and digital to RF in transmit mode, and/or at least one RF beamformer to generate one or more RF beams.

10 Claims, 9 Drawing Sheets

(51) Int. Cl.
*G01S 7/02* (2006.01)
*H05K 7/20* (2006.01)

(58) Field of Classification Search
CPC ........... H05K 7/20254; H05K 7/20272; H01Q 21/0025; H01Q 21/0087
See application file for complete search history.

(56) References Cited

U.S. PATENT DOCUMENTS

| | | | |
|---|---|---|---|
| 2011/0248796 A1* | 10/2011 | Pozgay | H01Q 25/02 333/137 |
| 2012/0319901 A1* | 12/2012 | Pruett | H01Q 3/26 342/372 |
| 2017/0356698 A1* | 12/2017 | Andersen | B23P 15/26 |
| 2018/0241255 A1* | 8/2018 | Leabman | H04B 5/0037 |
| 2018/0297144 A1* | 10/2018 | Mayberry | F28F 21/08 |
| 2019/0029105 A1* | 1/2019 | Smith | H01L 23/473 |
| 2020/0028278 A1* | 1/2020 | Tomasic | H01Q 15/244 |
| 2020/0029469 A1* | 1/2020 | McCordic | H01R 13/73 |
| 2020/0084920 A1* | 3/2020 | Frederick | H05K 7/20172 |
| 2020/0309466 A1* | 10/2020 | Mayberry | B23K 20/10 |
| 2020/0395644 A1* | 12/2020 | Bräuning | H01M 10/6567 |

\* cited by examiner

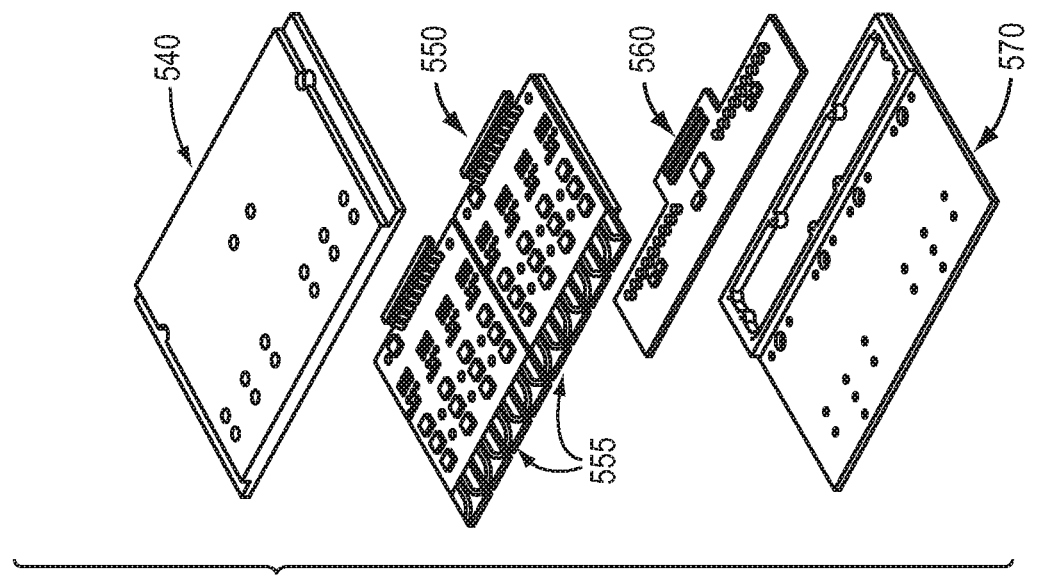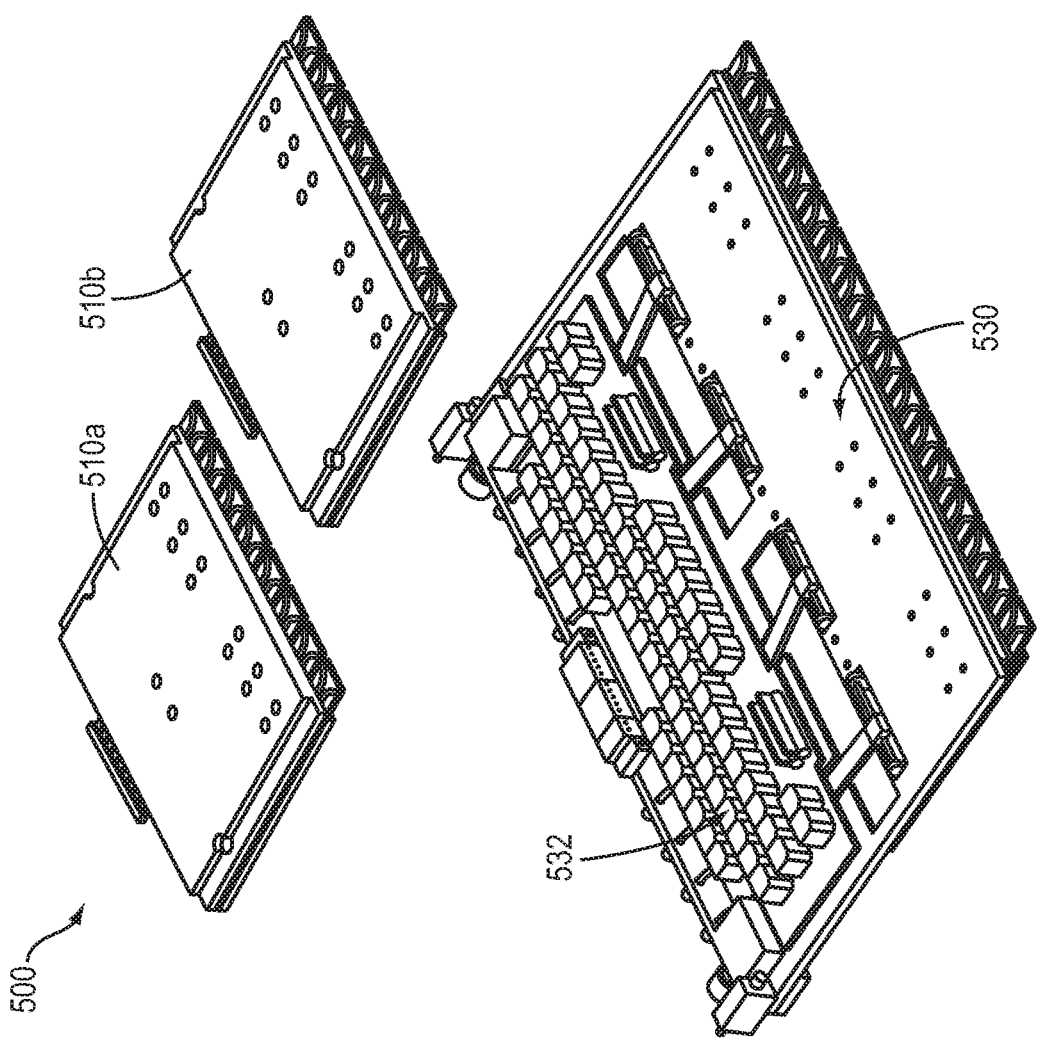
FIG. 5

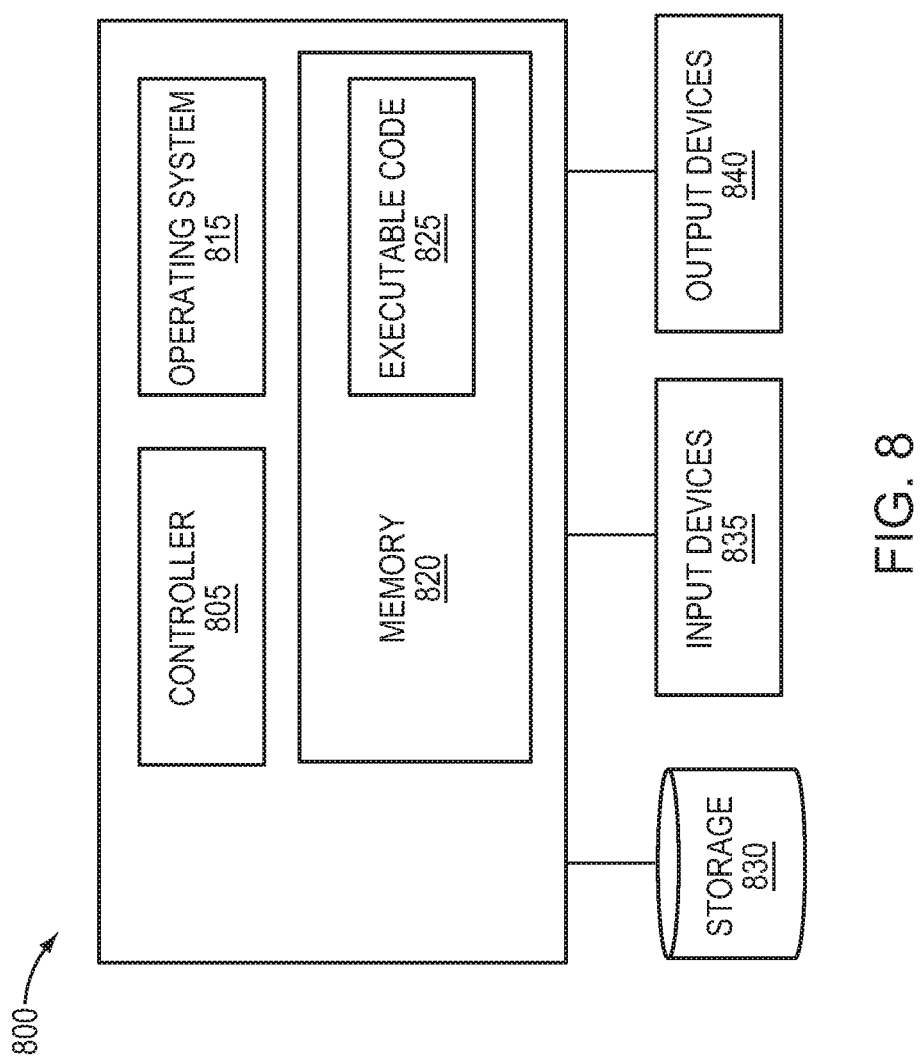

SYSTEMS AND METHODS FOR MODULAR RADAR SYSTEMS

CROSS REFERENCE TO RELATED APPLICATION

This application claims the benefit of and priority to U.S. Provisional Patent Application No. 62/853,522, filed on May 28, 2019, the entire contents of which are incorporated herein by reference in its entirety and owned by the owner of the instant application.

FIELD OF THE INVENTION

The invention relates generally to radar systems. In particular, to radar systems that can be modular and scalable using one or more radar system units to for example, provide varying radar capabilities.

BACKGROUND

Radar systems (e.g., radars) can be used to detect objects. For example, radar systems can be used on airplanes, ships, and/or ground vehicles. For each different radar application (e.g., ground, air, sea, military, commercial, etc.) the radar system can have different requirements and constraints. Typical radar requirements can include an ability to detect objects within a particular field of view, range, and/or elevation with a particular accuracy and/or sensitivity. Typical radar constraints can include cost, size, weight, power or cooling.

Typically, in order for a radar system to comply with different requirements and/or constraints, the radar system is designed and built for those specific requirements and/or constraints, such that when the requirements/constraints change, the radar system typically is rebuilt/redesigned. Building/designing a new radar system for each new set of requirements can be costly and time consuming. Therefore, it can be desirable to minimize the amount of time and/or cost it can take to build/design new radar systems.

Radar systems with higher power levels (e.g., 50-500 kW) are typically heavy and/or large, and can require large power and/or cooling systems, which can further contribute to the cost of the radar system. Therefore, it can be desirable to design more efficient radar systems with smaller less expensive power and cooling systems. It can also be desirable to reduce the overall size of radar systems while maintaining performance.

Therefore, it can be desirable to provide a more efficient lower cost, lighter weight, modular and/or scalable radar system.

SUMMARY OF THE INVENTION

Advantages of the invention can include the ability to use a modular component to build radar systems having varying requirements. Advantages of the invention can include more efficient power utilization and/or cooling providing within radar system unit Advantages of the invention can also include reducing the overall cost of radar system, reducing overall weight, reducing complexity, and/or minimizing the amount of radar system design time for new systems. For example, for an X-band radar, the weight can be reduced by a factor of two. By using and integrated flared notch radiator, for example, radio frequency (RF) loss in radar systems can be reduced by 50%. By making the radar modular and scalable, for example, radar systems of different performance can be realized without significant design effort.

BRIEF DESCRIPTION OF THE DRAWINGS

Non-limiting examples of embodiments of the disclosure are described below with reference to figures attached hereto that are listed following this paragraph. Dimensions of features shown in the figures are chosen for convenience and clarity of presentation and are not necessarily shown to scale.

The subject matter regarded as the invention is particularly pointed out and distinctly claimed in the concluding portion of the specification. The invention, however, both as to organization and method of operation, together with objects, features and advantages thereof, can be understood by reference to the following detailed description when read with the accompanied drawings. Embodiments of the invention are illustrated by way of example and not limitation in the figures of the accompanying drawings, in which like reference numerals indicate corresponding, analogous or similar elements, and in which:

FIG. 5 is a three-dimensional diagram of an RF transmit and receive assembly, according to some embodiments of the invention.

FIG. 8 is a high-level block diagram of an exemplary computing device which can be used with embodiments of the invention.

It will be appreciated that for simplicity and clarity of illustration, elements shown in the figures have not necessarily been drawn accurately or to scale. For example, the dimensions of some of the elements can be exaggerated relative to other elements for clarity, or several physical components can be included in one functional block or element.

DETAILED DESCRIPTION

In the following detailed description, numerous specific details are set forth in order to provide a thorough understanding of the invention. However, it will be understood by those skilled in the art that the invention can be practiced without these specific details. In other instances, well-known methods, procedures, and components, modules, units and/or circuits have not been described in detail so as not to obscure the invention.

In general, the invention involves a radar system unit that is used as a modular element to create a modular radar system. For example, the modular radar system can include 1, 2, 3 ... or n, where n is an integer, radar system units that include the same components. Each radar system unit can include multiple components (e.g., an RF transmit and receive assembly, a mount, a cooling element and/or one or more controllers and processors) that are coupled together such that each radar system unit can output one or more radar beams. When the radar system units are put together to form the modular radar system, the modular radar system can have an output that is equal to the sum of all of the individual radar system units. In this manner, the invention can provide a modular, scalable, flexible, radar system.

Figure 1:
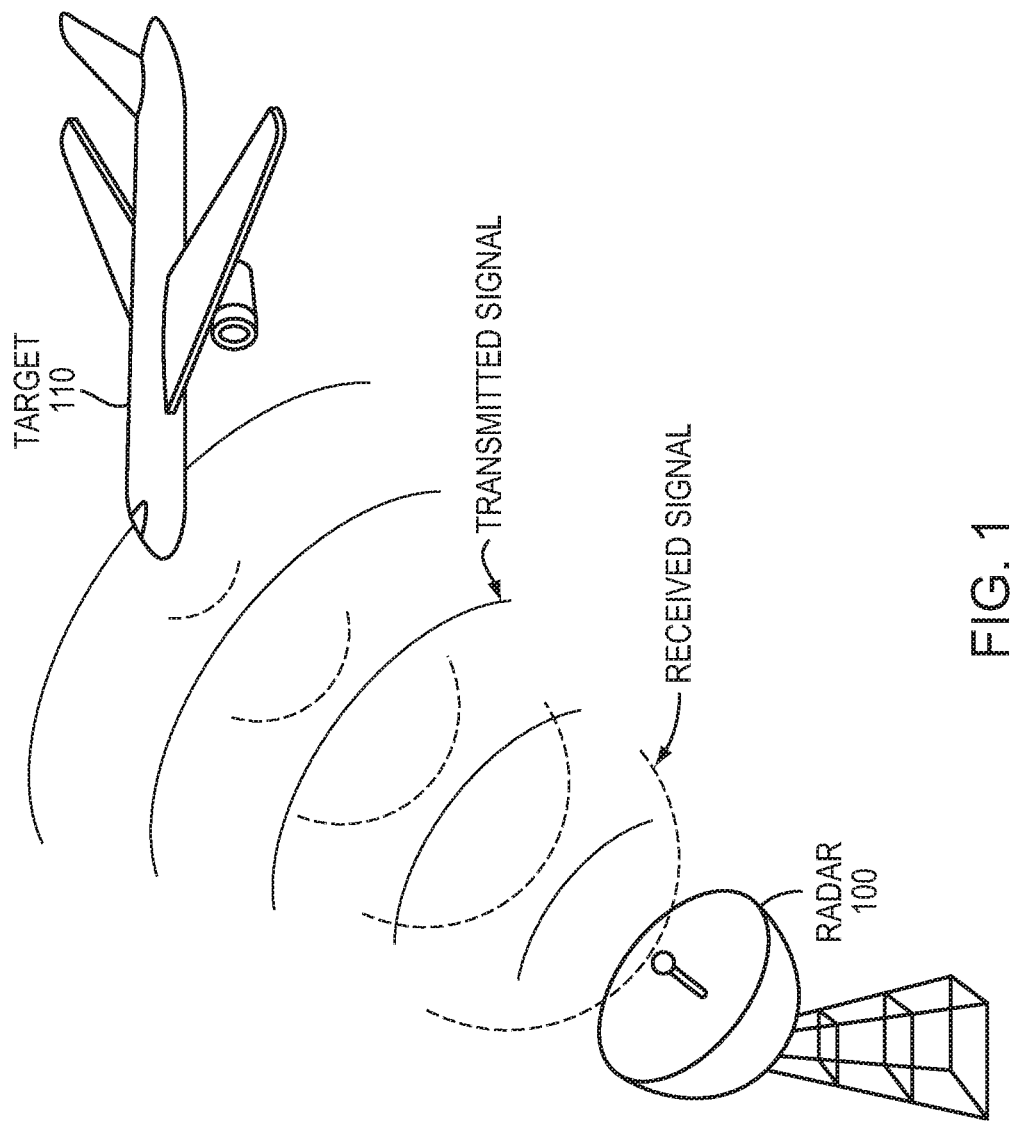
FIG. 1 is an example of a radar system and object, according to some embodiments of the invention.

FIG. 1 is an example of a radar system 100 and an object 110, according to some embodiments of the invention. The radar system 100 can emit electromagnetic energy (e.g., the transmitted signal). When the transmitted signal impinges upon the object 110, at least a portion of the transmitted signal is reflected from the object 110 and is received by the radar system 100, such that the radar system 110 can detect the object 110 exists.

Figure 2:
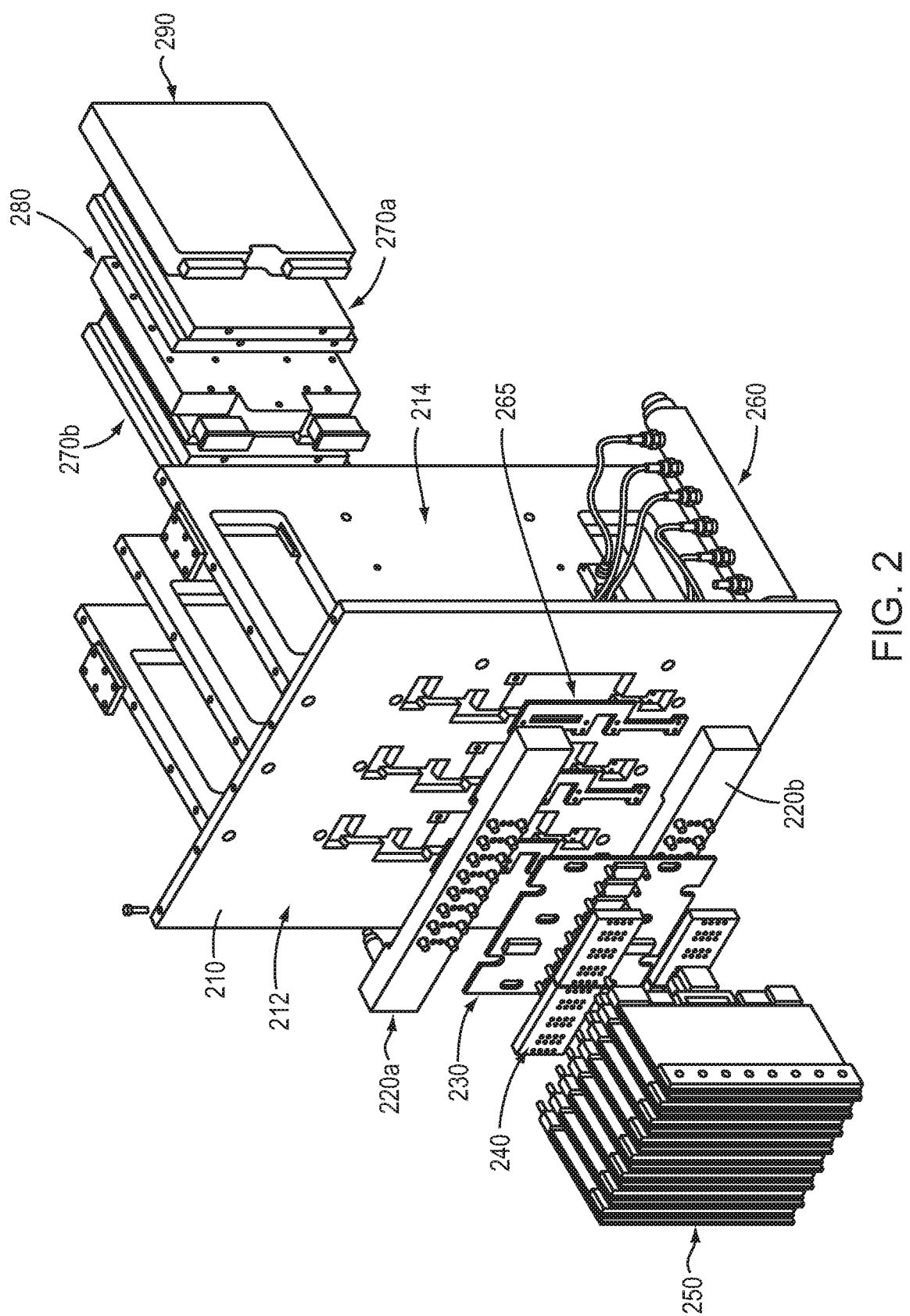
FIG. 2 is a three-dimensional diagram of a radar system unit, according to some embodiments of the invention.

FIG. 2 is a three-dimensional diagram of a radar system unit 200, according to some embodiments of the invention. The radar system unit 200 includes a mount 210, cooling manifolds 220a, 220b, a midplane board 230, overlapped beam formers 240a, 240b, eight radio-frequency (RF) transmit and receive assembly 250 (also commonly referred to as a slat), connectors 265, a coolant distribution manifold 260, two digital receiver and exciters (DREX) 270a, 270b, a slat control processor 280, and a slat power processor 290. The mount 210 includes a plate 212 and three vertical portions 214.

Figure 3B:
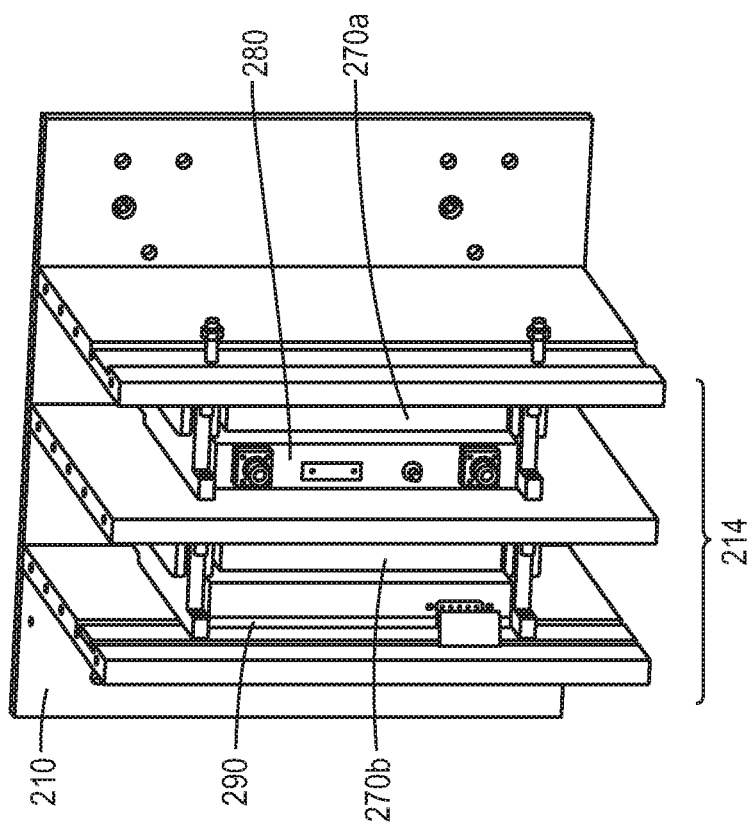
FIG. 3b is a three-dimensional diagram of a rear view of the radar system unit of FIG. 2, according to some embodiments of the invention.
Figure 3A:
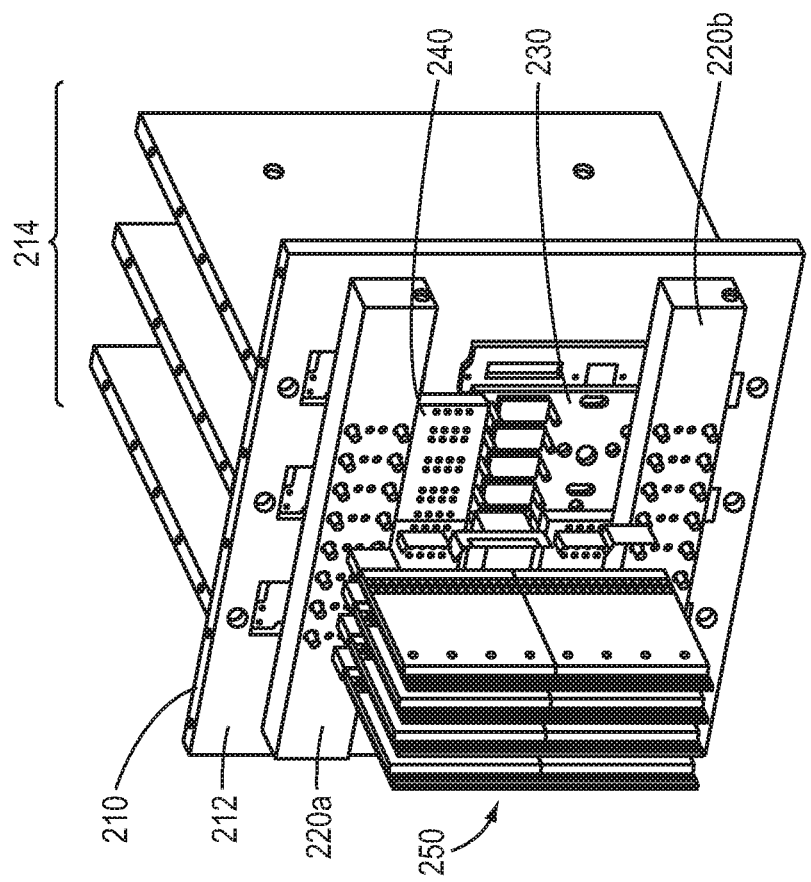
FIG. 3a is a three-dimensional diagram of a front view of the radar system unit of FIG. 2, according to some embodiments of the invention.

FIG. 3a and FIG. 3b show the radar system unit 200 parts connected via a front view in FIG. 3a and a rear view in FIG. 3b, according to some embodiments of the invention. As shown in FIG. 3a, the cooling manifolds 220a, 220b, couple to the plate 212. The midplane board 230 couples to the plate 212. The overlapped beam formers 240a, 240b couple to the midplane board 230. The eight slat assemblies 250 couple to the overlapped beam formers 240a, 240b, the midplane board 230 and the cooling manifolds 220a, 220b.

The two DREX 270a, 270b, the slat control processor 280 and the slap power processor 290 couple to the mount 210. The coolant distribution manifold 260 (not shown) couples to the mount 210. In some embodiments, the three vertical portions 214 each have an interior cavity such that cooling fluid provided by the coolant distribution manifold 260 can flow into each of the vertical portions to cool the two DREX 270a and 270b, the slat control module 280, and/or the slat power module 290 when positioned between the three vertical portions 214 on the mount 210.

Although eight slats are shown in FIG. 2, the number of slats in a given radar system unit can be based on a desired power output for the radar unit. For example, the radar system unit can have 1 slat, 2 slats, 3 slats, ..., n slats, where n is an any integer value. In various embodiments, the number of slats and/or number of radar system units is based on size/distance of an object to track. For example, assume radar system unit having 8 slats, each slat having 32 antennas, in other words a 256 element building block. In order to track an object that is half the size at the same distance it can be possible to use 26% more slats. Increasing the number of slats can occur by employing 26% more of the 256 element building blocks increasing the number of slats in a building block, increasing each slat to have more antennas or any combination thereof.

The radar system unit 200 can output one or more radar beams at a X-Band, C-Band or S-Band.

The radar system unit 200 can have a weight of 0.5 lb to 1.0 lb. In some embodiments, the mount 210 is aluminum. In some embodiments, the mount is a material having strength between 14 and 35 ksi (14,000-35,000 psi) yield strength, a thermal conductivity between 150-200 W/m-K, a density of 2700 kg/m^3, or any combination thereof.

In various embodiments, the cooling manifolds 220a, 220b and/or the coolant distribution manifold 260 are liquid filled cold plates. In various embodiments, the cooling manifolds 220a, 220b and/or the coolant distribution manifold 260 are vacuum brazed aluminum structures. In various embodiments, the cooling manifolds 220a, 220b and/or the coolant distribution manifold 260 have channels that include lanced offset finstock. In various embodiments, the cooling manifolds 220a, 220b and/or the coolant distribution manifold 260 are 3D printed.

In various embodiments, the cooling manifolds 220a, 220b can be positioned such that channels of the cooling manifolds are positioned relative to the high heat dissipating elements (e.g., high dissipating amplifiers) such that the high heat dissipating elements are directly cooled. In contrast, many prior systems only include cooling on the sides of the structures, such that elements on the center were typically not directly cooled, and thus the entire radar system was typically limited by this factor. An ability to more directly cool the high heat dissipating elements can allow for less errors in performance.

In some embodiments, each RF transmit and receive assembly's cooling manifolds provide a different level of cooling to, for example, accommodate for varying levels of head dissipation that can exits, for example, in a radar system unit. For example, although the elements in each RF transmit and receive assembly can be the same, there can be variance in the heat dissipated in each assembly, due to for example, manufacturing variances, position on in the radar system unit, or any combination thereof. The cooling manifolds can be set to account for these differences (e.g., based on a thermal profile of the radar system unit and/or the radar system), such that the entire radar system unit and/or the radar system, can have a uniformly, or substantially uniform temperature.

In various embodiments, the cooling fluid that flows through the three vertical planes is ethylene glycol and water mixture or propylene glycol and water mixture. In some embodiments, the midplane board 230 is a backplane of a typical computing device. In some embodiments, the slat control module 280 is a processor. In some embodiments, the slat power module 290 is a processor and includes power converter elements.

As is apparent to one of ordinary skill in the art, the number of elements and the particular configuration shown in the FIG. 2, FIG. 3a and FIG. 3b are one configuration of a radar system unit. Depending upon the particular radar requirements, variance in the type of elements of the radar system unit, the shape of the mount, and/or variance in the number of the elements shown can occur.

For example, for radar systems that require a high output, an additional power module can be used. In various embodiments, there are n number of cooling manifolds, where n is an integer. In various embodiments, there are n number of slat control modules, where n is an integer. In various embodiments, there are n number of slat power modules, where n is an integer. In various embodiments, there are n number of DREX, where n is an integer. In various embodiments, there are n number of midplane boards, where n is an integer. In various embodiments, the array plate is rectangular, square, circular, triangular, oval, and/or any shape as is accommodating to the desired elements. In various embodiments, the three vertical portions are horizontal, diagonal and/or any combination thereof.

Figure 3C:
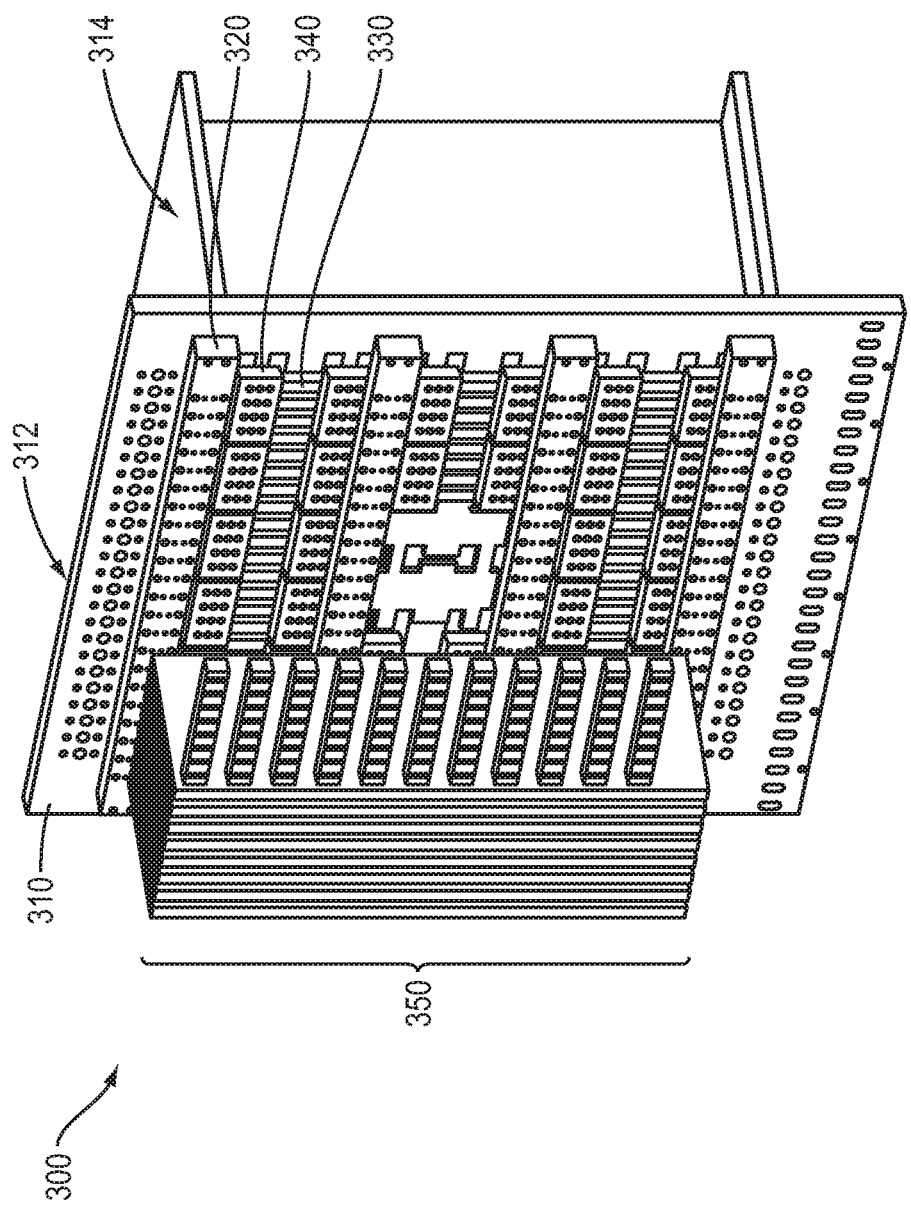
FIG. 3c is a three-dimensional front view of a modular radar system that can receive multiple radar system units, according to some embodiments of the invention.

FIG. 3c is a three-dimensional front view of a modular radar system 300 that can receive multiple radar system units (e.g., radar system unit 200 as described above in FIG. 2), according to some embodiments of the invention. The modular radar system 300 can include a mount 310 that is sized to accommodate multiple radar system units. A plate 312 of the mount 310 includes the elements that are coupled to the plate 212 of the radar system unit 200 repeated k times, where k is an integer. For each radar system unit 200 shown on the front view of FIG. 3c, corresponding rear view elements, as described above in FIG. 3b are coupled to the rear of the mount 312.

The modular radar system 300 includes a mount 310, n cooling manifolds 320, n midplane boards 330, n overlap beam formers 340, n groups of eight RF transmit and receive assemblies 350, n groups of connectors 365, n coolant distribution manifolds (not shown), n groups of two DREX, n slat control modules and n slat power modules, where n is an integer.

The mount 312 includes the plate 312 and n vertical portions 314, where n is an integer.

During operation, in typical radar system power modules, control modules and DREXs can typically require replacement every few months, whereas antenna's typically need replacement every couple of years. Embodiments of the invention can allow for more easy maintenance and part replacement of radar systems. As can be seen in FIGS. 3a-3c, the radar system unit 200 includes the slat power modules, slat control modules, and DREXs that are positioned on the rear of the mount and the slats that include the antennas on the front of the mount. The front of the radar system (e.g., the slats that include the antennas) can be positioned within a radome which is typically not easily removed, whereas the power and control modules can be positioned on the rear of the radar system, and left uncovered, such that they can be more easily replaced.

Figure 4:
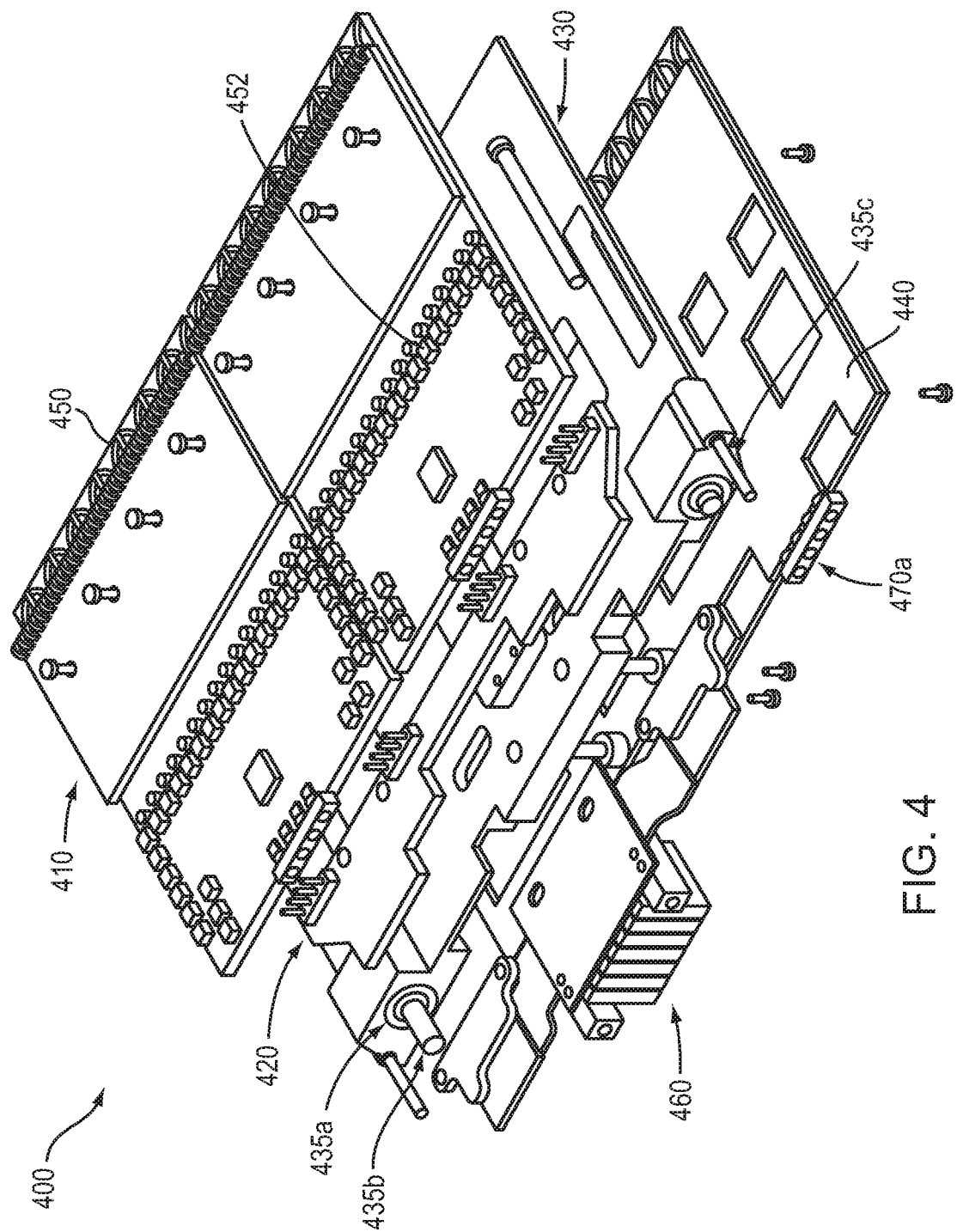
FIG. 4 is a three-dimensional diagram of a radio-frequency (RF) transmit and receive assembly, according to some embodiments of the invention.

FIG. 4 is a three-dimensional diagram of a radio-frequency (RF) transmit and receive assembly (e.g., slat) 400 (e.g., one slat of the eight slats 250 described above in FIG. 2), according to some embodiments of the invention. The slat 400 includes a first board of integrated circuits 410, a distribution board 420, a cooling manifold 430, a bottom plate 440.

The first board of integrated circuits 410 includes a first plurality of antennas 450 (also commonly referred to as radiators and/or receivers), a plurality of capacitors 452, and corresponding electronics (e.g., power amplifier, low noise amplifier, and other elements as are known in the art). The first board of integrated circuits 410 can be a FPGA. The plurality of antennas 450 can be phased array antennas.

The first board of integrated circuits 410 can connect to the distribution board 420. The distribution board 420 is coupled to the cooling manifold 430. The cooling manifold 430 can include two connectors 435a, 435b, and an alignment pin 435c. The two connectors 435a, 435b, and the alignment pin 435c can couple to the two cooling manifolds 220a, 220b. The first connector of the two connectors 435a can be a tube such that cooling fluid can flow between the two cooling manifolds 220a, 220b and the cooling manifold 430. In some embodiments, the first connector of the two connectors 435a can include an o-ring such that a seal can be made when the first connector connects to the cooling manifolds 220a, 220b.

The second connector of the two connectors 435b can be a quick disconnect connector. The alignment pin 435c couples to the two cooling manifolds 220a, 220b, to, for example, ensure the cooling manifold 430 is in a proper position with respect to the two cooling manifolds 220a, 220b. In various embodiment, there are more or fewer connectors on the cooling manifold 430 and/or the cooling manifolds 200a, 220b. The cooling manifold 430 is coupled to the bottom plate 440.

The bottom plate 440 includes a second plurality of antennas 445, midplane interface assembly 460 and two RF connectors 470a, 470b. The midplane interface assembly 460 connects to the midplane 230 as shown above with respect to FIG. 2. The RF connectors 470a, 470b connect to the overlapped beam formers 240a, 240b as shown above in FIG. 2.

In some embodiments, the cooling manifold 430 is a vacuum brazed or gun drilled aluminum having cooling liquid of ethylene glycol and water or propylene glycol and water.

In various embodiments, the RF transmit and receive assembly 400 has a length, height and width of 12-24 inches. In some embodiments, the RF transmit and receive assembly 400 has a weight of 5-25 lbs.

In some embodiments, the number of antennas in the first plurality of antennas 450 is 16. In some embodiments, the number of antennas in the first plurality of antennas 445 is 16. In some embodiments, 8 slats can be used in one radar system unit, and each slat can include 32 antennas, such that one radar system unit is a 256 element unit.

The distribution board can distribute power and control to the plurality of antennas.

In some embodiments, the parts of the RF transmit and receive assembly 400 are a printed wiring board.

During operation, the first board of integrated circuits 410 is coupled to the mount (as shown above in FIG. 2), such that RF energy, power and control signals are transmitted via the connectors to the first board of integrated circuits 410 such the first board of integrated circuits 410 emits and receives electromagnetic energy, as shown in above in FIG. 1. In this manner, each slat is a reproduceable repeatable element of the radar system unit. And each radar system unit is a reproduceable repeatable element that can be a building block for a radar system.

In various embodiments, the RF transmit and receive assembly 400 components are positioned relative to each other in other configurations. For example, turning to FIG. 5, FIG. 5 is a three-dimensional diagram of an RF transmit and receive assembly 500 configured differently than the RF transmit and receive assembly 400, according to some embodiments of the invention. The RF transmit and receive assembly 500 includes two RF sub-assemblies 510a, 510b, a dilation board 520, and a bottom plate 530.

Each of the two RF sub-assemblies includes a cover 540, a circuit board 550 with corresponding electronics having a first plurality of antennas 555, a logic board 560, and a carrier plate 570. The two RF sub-assemblies are coupled to dilation board 520 and the bottom plate 530. The dilation board 520 includes a plurality of capacitors 532. The dilation board 520 is coupled to the bottom plate 530.

The bottom plate 530 includes a second plurality of antennas 560. The bottom plate 530 can include an interior cavity such that a cooling fluid can flow through the bottom plate 530. The bottom plate 530 can provide cooling for the RF transmit and receive assembly 500. In some embodiments, the logic board 560 is an integrated circuit.

Figure 6:
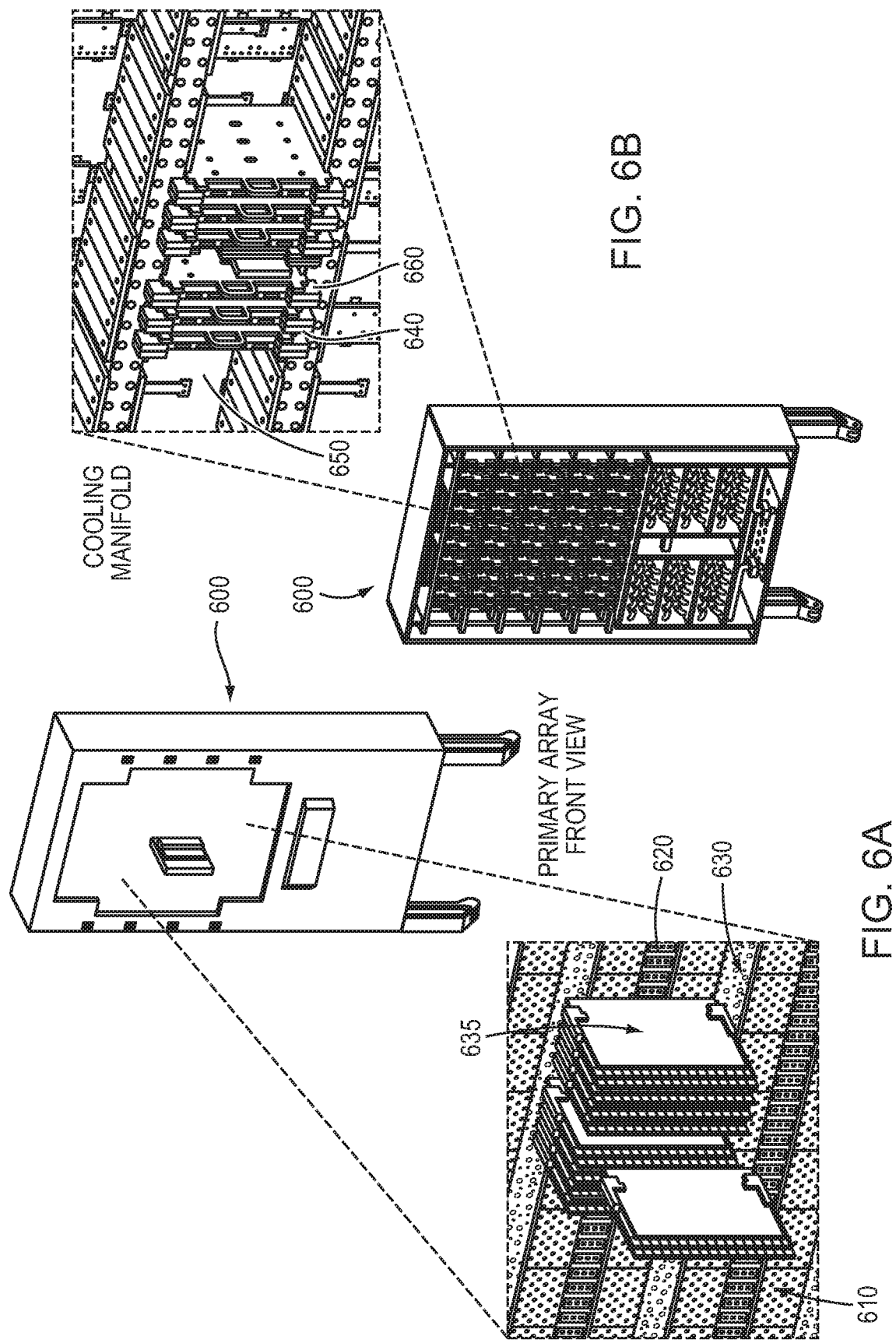
FIG. 6a and FIG. 6b are three-dimensional front and review views, respectively, of a modular radar system, according to some embodiments of the invention.

The RF transmit and receive assembly 500 can include two cooling manifold connectors 505a, 505b, a midplane connector 502 and beamformer connectors 507. Turning to FIG. 6a and FIG. 6b, FIGS. 6a and 6b are three-dimensional front view 605 and rear view 608 of a modular radar system 600 that can receive the RF transmit and receive assembly 500, according to some embodiments of the invention. The modular radar system 600 can include m overlap beam formers 610, m midplane boards 620, m cooling manifolds 630, m slats 635, m slat control modules 640, m slat power modules 650, m DREX 660, where m is an integer. The number of overlap beam formers 610, midplane boards 620, cooling manifolds 630, slat control modules 640, slat power modules 650, and DREX 660 can depend upon the number of RF transmit and receive assemblies to be included in the radar system unit 500. For example, assume the modular radar system has a mount that has a plate that can accommodate 2 radar system units across. If the modular radar system is to include 4 radar system units, where each radar system unit has slats configured as shown in FIG. 5, in this example, the modular radar system can include 4 cooling manifolds, 2 midplanes, and four overlap beam formers.

Figure 7:
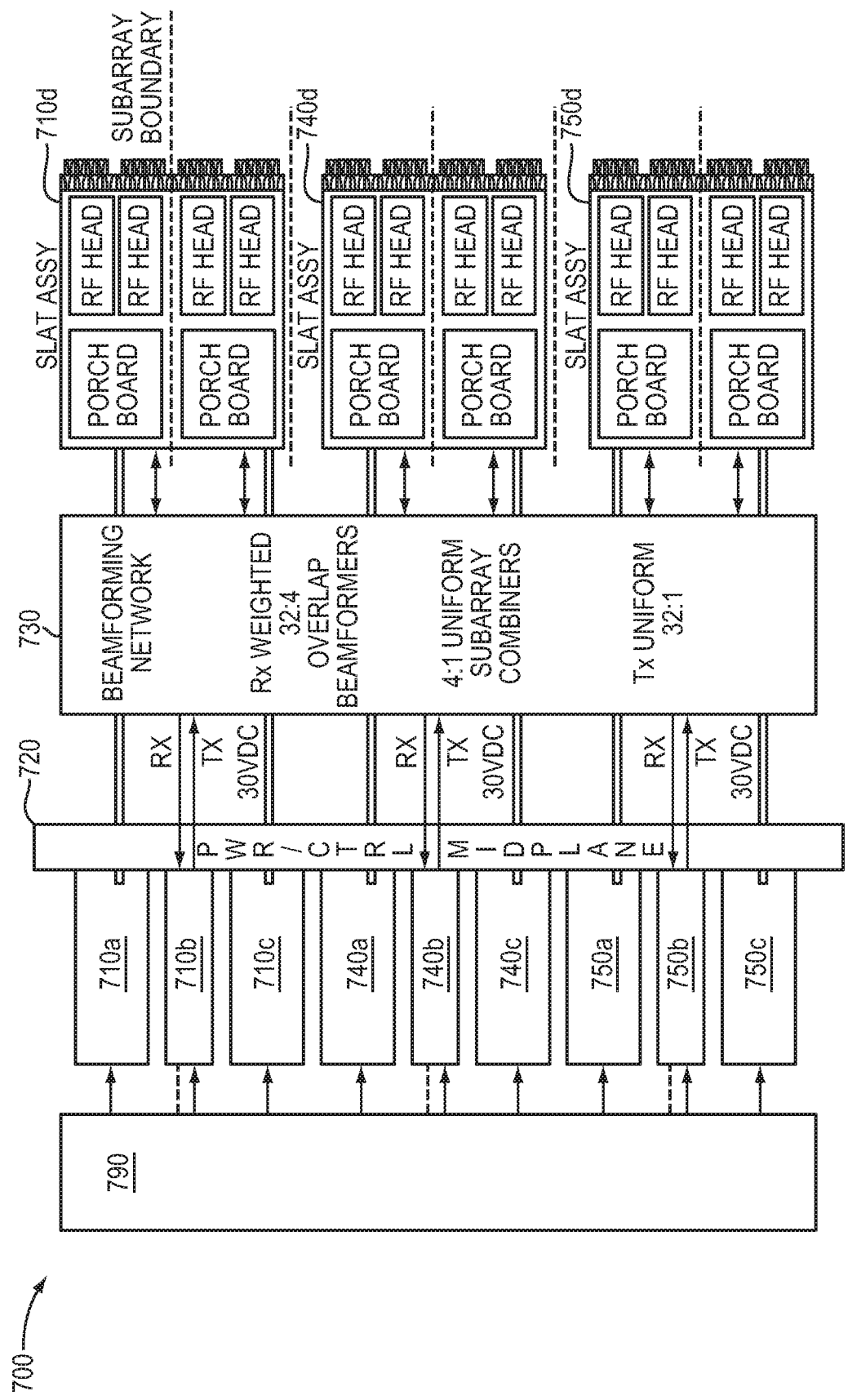
FIG. 7 is a three-dimensional block diagram of a modular radar system, according to some embodiments of the invention.

FIG. 7 is a block diagram of a modular radar system 700, according to some embodiments of the invention. The modular radar system 700 includes three radar system units. The first radar system unit includes the slat control module 710a, DREX 710b, slat power module 710c, midplane 720, beamformer 730, a plurality of slats 710d. The second radar system unit includes the slat control module 740a, DREX 740b, slat power module 740c, midplane 720, beamformer 730, a plurality of slats 740d. The third radar system unit includes the slat control module 750a, DREX 750b, slat power module 750c, midplane 720, beamformer 730, a plurality of slats 750d. All of the radar system units are coupled to a processor 790 and a power supply (not shown) to form the modular radar system 700. In various embodiments there are more or less radar system units.

FIG. 8 is a high-level block diagram of an exemplary computing device which can be used with embodiments of the invention. Computing device 800 can include a controller or processor 105 that can be or include, for example, one or more central processing unit processor(s) (CPU), one or more Graphics Processing Unit(s) (GPU or GPGPU), a chip or any suitable computing or computational device, an operating system 815, a memory 820, a storage 830, input devices 835 and output devices 840. Each of modules and equipment such as processors, modules, boards, integrated circuits as referred to above, and other equipment mentioned herein can be or include a computing device such as included in FIG. 2, although various units among these entities can be combined into one computing device.

Operating system 815 can be or can include any code segment designed and/or configured to perform tasks involving coordination, scheduling, arbitration, supervising, controlling or otherwise managing operation of computing device 800, for example, scheduling execution of programs. Memory 120 can be or can include, for example, a Random Access Memory (RAM), a read only memory (ROM), a Dynamic RAM (DRAM), a Synchronous DRAM (SD-RAM), a double data rate (DDR) memory chip, a Flash memory, a volatile memory, a non-volatile memory, a cache memory, a buffer, a short term memory unit, a long term memory unit, or other suitable memory units or storage units. Memory 820 can be or can include a plurality of, possibly different memory units. Memory 820 can store for example, instructions to carry out a method (e.g. code 825), and/or data such as user responses, interruptions, etc.

Executable code 825 can be any executable code, e.g., an application, a program, a process, task or script. Executable code 825 can be executed by controller 805 possibly under control of operating system 815. For example, executable code 825 can when executed cause the antenna's to emit radiation and/or receive radiation for processing according to embodiments of the invention. In some embodiments, more than one computing device 800 or components of device 800 can be used for multiple functions described herein. For the various modules and functions described herein, one or more computing devices 800 or components of computing device 800 can be used. Devices that include components similar or different to those included in computing device 800 can be used, and can be connected to a network and used as a system. One or more processor(s) 805 can be configured to carry out embodiments of the invention by for example executing software or code. Storage 830 can be or can include, for example, a hard disk drive, a floppy disk drive, a Compact Disk (CD) drive, a CD-Recordable (CD-R) drive, a universal serial bus (USB) device or other suitable removable and/or fixed storage unit. Data such as instructions, code, NN model data, parameters, etc. can be stored in a storage 830 and can be loaded from storage 830 into a memory 820 where it can be processed by controller 805. In some embodiments, some of the components shown in FIG. 2 can be omitted.

Input devices 835 can be or can include for example a mouse, a keyboard, a touch screen or pad or any suitable input device. It will be recognized that any suitable number of input devices can be operatively connected to computing device 800 as shown by block 835. Output devices 840 can include one or more displays, speakers and/or any other suitable output devices. It will be recognized that any suitable number of output devices can be operatively connected to computing device 800 as shown by block 840. Any applicable input/output (I/O) devices can be connected to computing device 800, for example, a wired or wireless network interface card (NIC), a modem, printer or facsimile machine, a universal serial bus (USB) device or external hard drive can be included in input devices 835 and/or output devices 840.

Embodiments of the invention can include one or more article(s) (e.g. memory 820 or storage 830) such as a computer or processor non-transitory readable medium, or a computer or processor non-transitory storage medium, such as for example a memory, a disk drive, or a USB flash memory, encoding, including or storing instructions, e.g., computer-executable instructions, which, when executed by a processor or controller, carry out methods disclosed herein.

One skilled in the art will realize the invention can be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

In the foregoing detailed description, numerous specific details are set forth in order to provide an understanding of the invention. However, it will be understood by those skilled in the art that the invention can be practiced without these specific details. In other instances, well-known methods, procedures, and components, modules, units and/or circuits have not been described in detail so as not to obscure the invention. Some features or elements described with respect to one embodiment can be combined with features or elements described with respect to other embodiments.

Although embodiments of the invention are not limited in this regard, discussions utilizing terms such as, for example, "processing," "computing," "calculating," "determining," "establishing", "analyzing", "checking", or the like, can refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium that can store instructions to perform operations and/or processes.

Although embodiments of the invention are not limited in this regard, the terms "plurality" and "a plurality" as used herein can include, for example, "multiple" or "two or more". The terms "plurality" or "a plurality" can be used throughout the specification to describe two or more components, devices, elements, units, parameters, or the like. The term set when used herein can include one or more items. Unless explicitly stated, the method embodiments described herein are not constrained to a particular order or sequence. Additionally, some of the described method embodiments or elements thereof can occur or be performed simultaneously, at the same point in time, or concurrently.

What is claimed is:

1. A modular radar system, the system comprising:
   a plurality of radar system modules detachably coupled together, each of the plurality of radar system modules having a predetermined output power and output frequency, each of the plurality of radar system modules comprising:
      a predefined number of radio-frequency (RF) transmit and receive assemblies coupled to a cooling manifold, each of the predefined number of RF transmit and receive assemblies comprising at least one radiating element that emits electromagnetic radiation;
      at least one processor coupled to a mount to control power of the electromagnetic radiation of the at least one radiating element;
      at least one controller coupled to the mount to control the predefined number of RF transmit and receive assembly, the power unit and the digital receiver and exciter module;
      at least one digital receiver and exciter coupled to the mount to convert RF to digital in receive mode, and digital to RF in transmit mode;
      at least one RF beamformer coupled to the mount to generate one or more RF beams; and
      a midplane coupled to a) the mount, b) the first processor, c) the second processor, and d) the predefined number of RF transmit and receive assemblies,
   wherein a number of radar system modules in the plurality of radar system modules is based on a desired power output for the modular radar system.

2. The modular radar system of claim 1 wherein a number of the plurality of radar system modules used is based on a desired range for the radar system, desired accuracy for the radar system, desired sensitivity for the radar system, or any combination thereof.

3. The modular radar system of claim 1 wherein a number of the plurality of radar system modules used is based on whether the radar system is sectored or has 360 degree coverage, a number of radar faces, power available for the radar system, or any combination thereof.

4. The modular radar system of claim 1 wherein the predefined number of RF transmit and receive assemblies is eight (8).

5. The modular radar system of claim 1 wherein each of the predefined number of RF transmit and received assemblies has 32 channels.

6. The modular radar system of claim 1 wherein each of the predefined number of RF transmit and receive assemblies further comprises an integral radiator.

7. The modular radar system of claim 1 wherein each of the predefined number of RF transmit and receive assemblies further comprises a 64 element subarray.

8. The modular radar system of claim 1 wherein the modular radar system can operate within S-band, C-band or X-band frequencies.

9. The modular radar system of claim 1 wherein each mount for each of the RF transmit and receive assemblies are aluminum.

10. The modular radar system of claim 1 wherein the cooling manifold comprises aluminum having cooling liquid of ethylene glycol and water or propylene glycol and water.

* * * * *